United States Patent
Leet et al.

(10) Patent No.: US 6,565,717 B1
(45) Date of Patent: *May 20, 2003

(54) APPARATUS FOR SPUTTERING IONIZED MATERIAL IN A MEDIUM TO HIGH DENSITY PLASMA

(75) Inventors: David Michael Leet, San Jose, CA (US); John C. Forster, San Francisco, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/929,965

(22) Filed: Sep. 15, 1997

(51) Int. Cl.[7] .............................................. C23C 14/34
(52) U.S. Cl. ............................ 204/192.12; 204/298.06; 204/298.08; 204/298.11; 204/298.16; 204/298.19; 204/298.2
(58) Field of Search ....................... 204/192.12, 298.01, 204/298.08, 298.06, 298.11, 298.16, 298.2, 298.21, 298.22, 298.17, 298.18, 298.19; 156/345; 118/723 I, 723 IR; 427/569, 571, 576

(56) References Cited

U.S. PATENT DOCUMENTS

| | | | | |
|---|---|---|---|---|
| 3,619,402 A | | 11/1971 | Wurm et al. | 204/298.12 |
| 3,878,085 A | * | 4/1975 | Corbani | 204/298 |
| 4,336,118 A | | 6/1982 | Patten et al. | |
| 4,362,632 A | | 12/1982 | Jacob | 422/186.04 |

(List continued on next page.)

FOREIGN PATENT DOCUMENTS

| | | |
|---|---|---|
| EP | 0520519 | 12/1992 |
| EP | 0607797 | 1/1994 |
| EP | 0774886 | 5/1997 |

(List continued on next page.)

OTHER PUBLICATIONS

U.S. patent application Ser. No. 08/812,657.
U.S. patent application Ser. No. 09/126,357.
P.M. Ryan, et al., "Methods of calculating selected geometrical effects in the design of ICRH antennas," Fusion Engineering and Design 24 (1994) 135–157.
D.W. Faulconer, "Adverse shielding of the heating field and high ohmic Isos introduced by electrostatic shields employed in radio–frequency heating of plasma," J.Appl. Phys. 54(7), Jul. 1983.
C.M. Fortgang, "Measurements of the Electrostatic and Electromagnetic Fields of Faraday–Shielded Hlaf–Turn Loop–Type ICRF Antennae," IEEE Transactions on Plasma Science, vol. PS–13, No. 6, Dec. 1985.
M. Kwon, et al., "Measurement of the Effects of Faraday Shields on ICRH Antenna Coupling," IEEE Transactions on Plasma Science, vol. 18, No. 2, Apr. 1990.

(List continued on next page.)

*Primary Examiner*—Rodney G. McDonald
(74) *Attorney, Agent, or Firm*—Konrad, Raynes, Victor & Mann (57) ABSTRACT

An apparatus and method for processing workpieces, which include a chamber having a coil for inductively coupling RF energy through a dielectric window into the chamber to energize a plasma, and a shield positioned between a sputtering target and the dielectric window to reduce or eliminate deposition of sputtered material onto a portion of the dielectric window. In the illustrated embodiment, the window shield is spaced from the dielectric window to define a gap and has at least one opening, which permit RF energy to be coupled through the gap and through the window shield opening to the interior of the chamber. As a consequence, the coil may be positioned exterior to the chamber to simplify construction and operation of the chamber.

64 Claims, 4 Drawing Sheets

U.S. PATENT DOCUMENTS

| | | | |
|---|---|---|---|
| 4,626,312 A | 12/1986 | Tracy | |
| 4,661,228 A | 4/1987 | Mintz | |
| 4,716,491 A | 12/1987 | Ohno et al. | 361/230 |
| 4,721,553 A | 1/1988 | Saito et al. | 204/192.12 |
| 4,792,732 A | 12/1988 | O'Loughlin | 315/334 |
| 4,842,703 A | 6/1989 | Class et al. | 204/192.12 |
| 4,844,775 A | 7/1989 | Keeble | 216/68 |
| 4,865,712 A | 9/1989 | Mintz | 204/298.16 |
| 4,871,421 A | 10/1989 | Ogle et al. | |
| 4,911,814 A | 3/1990 | Matsuoka et al. | 204/298.17 |
| 4,918,031 A | 4/1990 | Flamm et al. | 438/695 |
| 4,925,542 A | 5/1990 | Kidd | 427/531 |
| 4,941,915 A | 7/1990 | Matsuoka et al. | |
| 4,948,458 A | 8/1990 | Ogle | 438/729 |
| 4,990,229 A | 2/1991 | Campbell et al. | 204/298.06 |
| 4,999,096 A | 3/1991 | Nihei et al. | |
| 5,065,698 A | 11/1991 | Koike | 118/719 |
| 5,069,770 A | 12/1991 | Glocker | 204/192.12 |
| 5,091,049 A | 2/1992 | Campbell et al. | 216/37 |
| 5,122,251 A | 6/1992 | Campbell et al. | 204/298.06 |
| 5,135,629 A | 8/1992 | Sawada et al. | 204/192.12 |
| 5,146,137 A | 9/1992 | Gesche et al. | 315/111.21 |
| 5,175,608 A | 12/1992 | Nihei et al. | 257/751 |
| 5,178,739 A * | 1/1993 | Barnes et al. | 204/192.12 |
| 5,206,516 A | 4/1993 | Keller et al. | 250/492.2 |
| 5,225,740 A | 7/1993 | Ohkawa | 315/111.41 |
| 5,231,334 A | 7/1993 | Paranjpe | 315/111.21 |
| 5,234,529 A | 8/1993 | Johnson | 156/345 |
| 5,234,560 A | 8/1993 | Kadlec et al. | 204/192.12 |
| 5,240,880 A | 8/1993 | Hindman et al. | 438/656 |
| 5,241,245 A | 8/1993 | Barnes et al. | 315/111.41 |
| 5,280,154 A | 1/1994 | Cuomo et al. | 219/121.52 |
| 5,304,279 A | 4/1994 | Coultas et al. | 156/345.49 |
| 5,312,717 A | 5/1994 | Sachdev et al. | 430/313 |
| 5,346,578 A | 9/1994 | Benzing et al. | 156/345.48 |
| 5,361,016 A | 11/1994 | Ohkawa et al. | 315/111.41 |
| 5,366,585 A | 11/1994 | Robertson et al. | 216/67 |
| 5,366,590 A | 11/1994 | Kadomura | 438/723 |
| 5,368,685 A | 11/1994 | Kumihashi et al. | 216/70 |
| 5,397,962 A | 3/1995 | Moslehi | 315/111.51 |
| 5,401,350 A | 3/1995 | Patrick et al. | 156/345 |
| 5,404,079 A | 4/1995 | Ohkuni et al. | 315/111.81 |
| 5,417,834 A | 5/1995 | Latz | 204/298.11 |
| 5,418,431 A | 5/1995 | Williamson et al. | 315/111.51 |
| 5,421,891 A | 6/1995 | Campbell et al. | 118/723 R |
| 5,429,070 A | 7/1995 | Campbell et al. | 118/723 R |
| 5,429,710 A | 7/1995 | Akiba et al. | 438/714 |
| 5,429,995 A | 7/1995 | Nishiyama et al. | 438/788 |
| 5,430,355 A | 7/1995 | Paranjpe | 315/111.21 |
| 5,433,812 A * | 7/1995 | Cuomo et al. | 204/298.11 |
| 5,503,676 A | 4/1996 | Shufflebotham et al. | |
| 5,540,824 A | 7/1996 | Yin et al. | 204/298.34 |
| 5,560,776 A | 10/1996 | Sugai et al. | 118/723 AN |
| 5,569,363 A * | 10/1996 | Bayer et al. | 204/192.32 |
| 5,573,595 A | 11/1996 | Dible | |
| 5,614,055 A * | 3/1997 | Fairbairn et al. | 156/345 |
| 5,622,635 A | 4/1997 | Cuomo et al. | 216/68 |
| 5,690,795 A | 11/1997 | Rosenstein et al. | 204/192.1 |
| 5,728,280 A | 3/1998 | Scherer | 204/298.18 |
| 5,763,851 A | 6/1998 | Forster et al. | 219/121.43 |
| 5,800,688 A * | 9/1998 | Lantsman et al. | 204/298.11 |
| 5,948,215 A * | 9/1999 | Lantsman | 204/192.12 |
| 6,080,287 A * | 6/2000 | Drewery et al. | 204/192.15 |
| 6,132,566 A | 10/2000 | Hofmann et al. | 204/192.17 |

FOREIGN PATENT DOCUMENTS

| | | |
|---|---|---|
| EP | 0782172 | 7/1997 |
| EP | 0836218 | 4/1998 |
| EP | 0908922 | 4/1999 |
| GB | 2162365 | 1/1986 |
| GB | 2231197 | 11/1990 |
| JP | 59190363 | 10/1984 |
| JP | 61190070 | 8/1986 |
| JP | 02141575 | 5/1990 |
| JP | 6232055 | 8/1994 |
| JP | 6283470 | 10/1994 |
| JP | 7176398 | 7/1995 |
| JP | 7176399 | 7/1995 |
| JP | 8153712 | 6/1996 |
| JP | 8288259 | 11/1996 |
| WO | WO860623 | 11/1986 |
| WO | 9848444 | 10/1998 |

OTHER PUBLICATIONS

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

U.S. patent application Ser. No. 08/680,335, filed Jul. 10, 1996 (now abandoned).

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. patent application Ser. No. 08/647,184, filed May 9, 1996 (abandoned).

U.S. patent application Ser. No. 07/954,860, filed Sep. 30, 1992 (abandoned).

U.S. patent application Ser. No. 08/310,617, filed Sep. 30, 1992 patent 5,589,224.

U.S. patent application Ser. No. 08/567,601, filed Jun. 2, 1995 patent 5,803,977.

U.S. patent application Ser. No. 08/647,182, filed May 9, 1996 abandoned.

U.S. patent application Ser. No. 08/733,620, filed Oct. 17, 1996 exams. mailed.

U.S. patent application Ser. No. 08/741,708, filed Oct. 31, 1996 all.

* cited by examiner

APPARATUS FOR SPUTTERING IONIZED MATERIAL IN A MEDIUM TO HIGH DENSITY PLASMA

BACKGROUND OF THE INVENTION

The present invention relates to apparatus and methods for sputtering ionized material from a solid target, or cathode, onto a workpiece with the aid of an inductively coupled plasma.

A number of semiconductor device fabrication procedures include processes in which a material is sputtered from a target onto a workpiece, such as a semiconductor wafer. Material is sputtered from the target, which is appropriately biased, by the impact of ions created in the vicinity of the target. A certain proportion of the sputtered material is ionized by a plasma and the resulting ions are attracted to the wafer.

The wafer is mounted on a support and is biased to a DC potential selected to attract the sputtered, ionized material. Typically, the sputtered material is composed of positive ions and the workpiece is negatively biased.

There are several known techniques for exciting a plasma with RF fields including capacitive coupling, inductive coupling and wave heating. In a standard inductively coupled plasma (ICP) generator, RF current passing through a coil induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the primary winding of a transformer. The plasma acts as a single turn secondary winding of the transformer.

In a number of deposition chambers such as a physical vapor deposition chamber, the chamber walls are often formed of a conductive metal such as stainless steel. Because of the conductivity of the chamber walls, it is often necessary to place the RF coils or electrodes within the chamber itself because the conducting chamber walls would block or substantially attenuate the electromagnetic energy radiating from the antenna. As a result, the coil may be directly exposed to the deposition flux and energetic plasma particles. This is a potential source of contamination of the film deposited on the wafer, and therefore may be undesirable in some applications. To protect the coils, shields can be made from nonconducting materials, such as ceramics. However, many deposition processes involve deposition of conductive materials such as aluminum on the electronic device being fabricated. Because the conductive material will coat the ceramic shield, it will soon become conducting, thus again substantially attenuating penetration of electromagnetic radiation into the plasma.

U.S. Pat. No. 5,346,578 describes a system in which a plasma is created for the performance of various types of wafer processing operations, including etching and chemical vapor deposition in a hemispherical quartz vessel surrounded by a similarly shaped exterior induction coil. RF energy is transmitted from the coil through the dome into the chamber to energize the plasma. In the operation of the apparatus discussed in this patent, a reactive gas is introduced into the treatment chamber in order to be ionized by the plasma, the resulting ions being directed to a wafer under the influence of a suitable electric field. It is believed that the apparatus described in this reference is not suitable for the performance of conductive material sputtering processes because sputtered material tends to coat all interior surfaces of a chamber. Hence, the quartz dome would soon become relatively opaque to the RF energy from the coil.

Published European Patent Application 0607797 describes a device for generating a plasma in order to perform low pressure chemical vapor deposition or reactive ion etching operations. The system includes a processing chamber having, at its top, a planar spiral coil producing an electromagnetic field which will be coupled with a plasma within the processing chamber, the coil itself being isolated from the interior of the chamber by a flat dielectric window. The window is associated with a conductive shield which is positioned between the window and the coil. The purpose of the shield is to prevent dielectric material from being sputtered from the window. This publication suggests that the window and coil may, alternatively, be domed or hemispherical.

The material which is to be ionized in order to be deposited on a wafer or to perform etching is introduced into the chamber in the form of a process gas. As in the case of the apparatus described in U.S. Pat. No. 5,346,578, supra, the surface of the dielectric window which communicates with the interior of the chamber is prone to being coated with deposition material. Therefore, it is believed that this chamber is likewise not well suited to sputtering processes.

BRIEF SUMMARY OF THE INVENTION

It is an object of the present invention to provide an inductively coupled plasma processing apparatus which avoids drawbacks possessed by prior art apparatus of this type.

A more specific object of the invention is to produce a more uniform plasma in a processing chamber which contains a metal sputtering target.

Another object of the invention is to protect a dielectric window forming part of the boundary of the processing chamber against deposition of sputtered material.

A further object of the invention is to provide an improved sputtering apparatus having an external coil for inductively coupling energy into the plasma in the processing chamber.

The above and other objects and advantages are achieved, according to the present invention, by an apparatus and method for processing workpieces, which include a chamber having a coil for inductively coupling RF energy through a dielectric window into the chamber to energize a plasma, and a shield positioned between a sputtering target and the dielectric window to reduce or eliminate deposition of sputtered material onto a portion of the dielectric window. In the illustrated embodiment, the window shield is spaced from the dielectric window to define a gap and has at least one opening, which permit RF energy to be coupled through the gap and through the window shield opening to the interior of the chamber. As a consequence, the coil may be positioned exterior to the chamber to simplify construction and operation of the chamber.

In another aspect of the invention, the formation of a plasma having more uniform characteristics is facilitated. For example, by placing the plasma energizing coil outside the chamber, the coil may be readily shaped and positioned to achieve a desired plasma distribution without concern for the interaction between the coil structure and the flow of sputtered material in the chamber. Still further, multiple coils can be used while avoiding the expense and complexity of connecting multiple coils to external RF sources through the walls of the chamber.

In yet another aspect of the invention, the formation of a more uniform sputter deposition material flux may be facilitated. For example, by placing the plasma energizing coil or coils outside the chamber, the sputtering target or targets may be more readily shaped and positioned to achieve a desired deposition flux without concern for the interaction between any internal coil structure and the target. In various illustrative embodiments, the target has an annular ring structure which may improve the uniformity of deposition onto the workpiece.

DETAILED DESCRIPTION OF THE INVENTION

Figure 1:
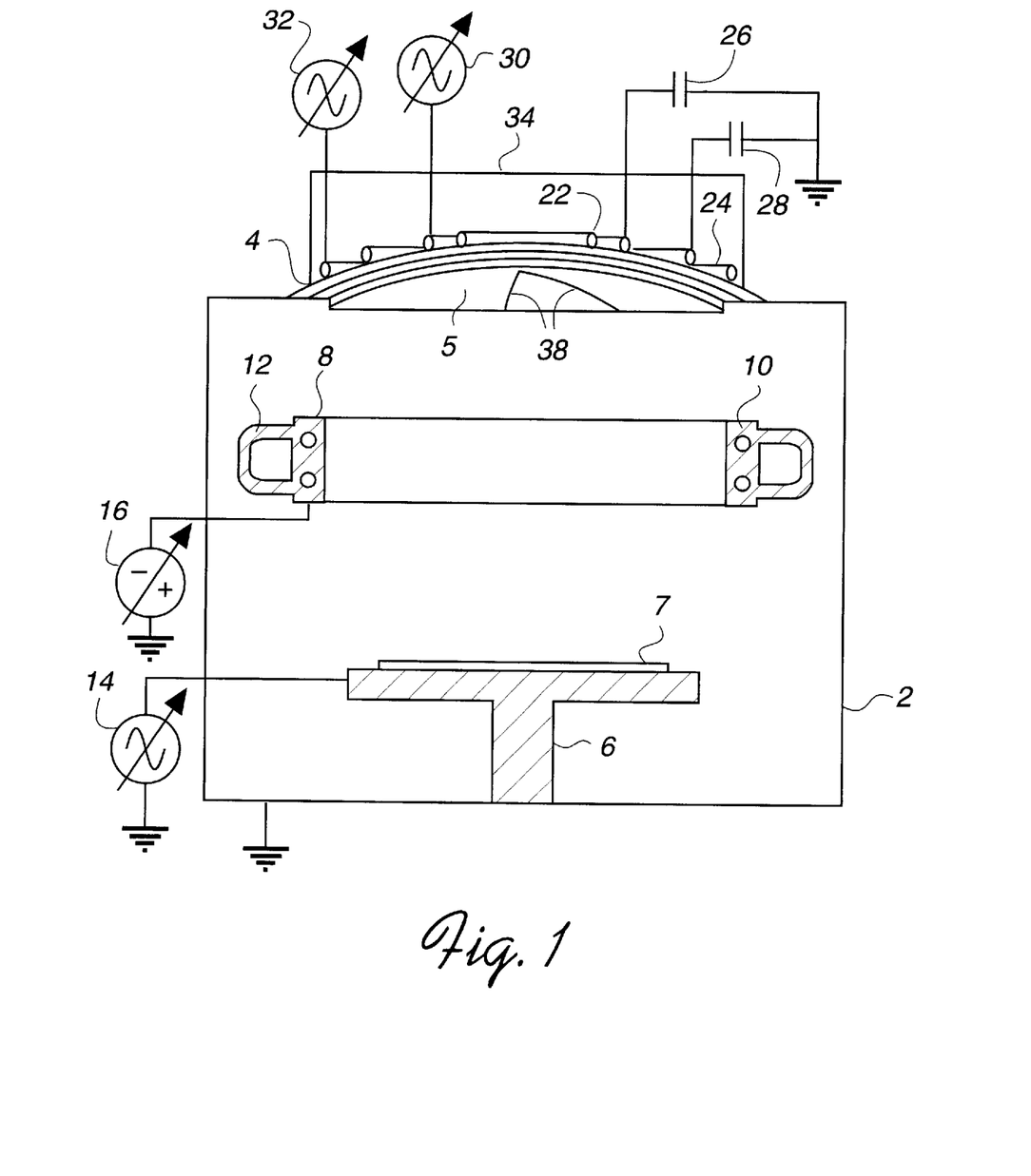
FIG. 1 is a simplified, elevational view, partly in cross section, of a first embodiment of apparatus according to the invention.

FIG. 1 is a simplified illustration of processing apparatus in which an inductively coupled plasma ionizes material sputtered from a target for delivery to a workpiece. Components of such apparatus which are conventional in this art are not illustrated so that novel components according to the invention can be viewed and comprehended more easily. Such conventional components include conduits for delivering a gas which is used to form the plasma, components for supporting the target and its associated magnet assembly and components for appropriately displacing the workpiece support.

The processing apparatus includes a vacuum chamber 2 having at its top an opening which is closed by a dielectric window 4. As explained in greater detail below, in accordance with one aspect of the invention, positioned in front of the window 4 is a sputter shield 5 which permits RF energy to be transmitted from a source exterior to the sputtering chamber 2, through the window 4 and inductively coupled with the plasma in the interior of the chamber, notwithstanding the deposition of sputtered conductive material onto the inner surface of the window 4.

The vacuum chamber 2 also has a second metal shield (not shown separately) that is coextensive with all of the chamber walls and normally electrically grounded, as shown. Within chamber 2 there is installed a workpiece support 6 providing a support surface. A workpiece 7 that may be constituted by one or a plurality of semiconductor wafers or panels is mounted on the support surface provided by workpiece support 6.

Within chamber 2 there is mounted, in any suitable manner known in the art for conventional sputtering targets, a ring-shaped metal sputtering target 8. Target 8 may be a solid body of an appropriate sputtering metal and may be formed to have an internal helical passage 10 through which a cooling fluid can be caused to flow.

Target 8 is surrounded by a permanent magnet assembly 12 which generates a magnetic flux configured to facilitate the creation of ions adjacent to the target 8. These ions strike one or more external surfaces of target 8 in order to dislodge, or sputter, atoms or clusters of atoms from target 8. Magnet assembly 12 may be mounted to be stationary or to rotate about a vertical center axis of chamber 2 which is concentric with target 8.

Support 6 and target 8 may be appropriately biased, in accordance with conventional practice in the art, to suitable, typically negative, potentials by AC and DC voltage sources 14 and 16, respectively. Although illustrated as contained wholly within the chamber 2, it is contemplated that the target 8 and assembly 12 may be mounted in the walls of the chamber 2 so that the outer portion of the target 8 and the assembly 12 are on the exterior of the chamber 2.

The dielectric window 4 is made, for example, of quartz and having a domed shape. This shape may be, for example, in the form of a segment of a sphere. However, other pressure resistant shapes are also possible. The window 4 may be formed of other nonconductive materials such as ceramic.

Above window 4 there are mounted two conductive coils 22 and 24 which are wound to conform to the domed shape of window 4. Coils 22 and 24 are spiral wound with respect to a vertical center axis (not shown) that may be coaxial with the vertical center axis of chamber 2, with coil 22 being enclosed, or surrounded, by coil 24. One end of each of coils 22 and 24 is connected to ground via a respective DC isolation capacitor 26, 28, while the other end of each of coils 22 and 24 is connected to a suitable, adjustable RF power source 30, 32. Each RF power source 30, 32 may be of any suitable conventional type. Coils 22 and 24 are enclosed in an RF shielding can 34.

The surface of dielectric window 4 which faces the interior of chamber 2 is covered by the metal shield 5, in the form of a dome-shaped sheet or plate. Window shield 5 is preferably made of an electrically conductive material and is coextensive with window 4 in order to cover the entire surface of window 4 which faces the interior of chamber 2. Window shield 5 may be conductively connected to the lower wall shield of chamber 2 and grounded thereby. In addition, window shield 5 may be of the same material as the wall shield of chamber 2.

Figure 2:
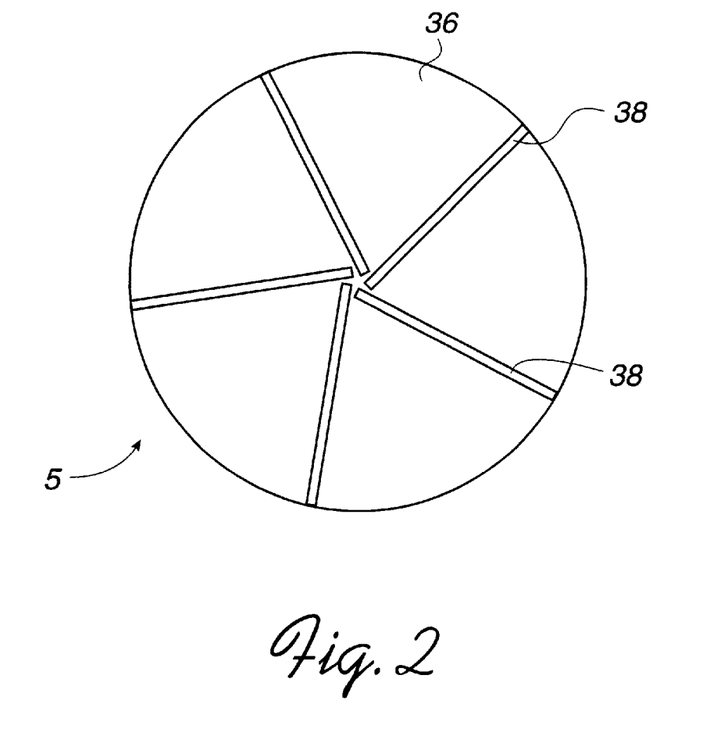
FIG. 2 is a plan view of one embodiment of the window shield of FIG. 1.

As shown more clearly in FIG. 2, window shield 5 is provided with a plurality of radially extending slots 38 which are distributed around the circumference of shield 5. Preferably, slots 38 extend from the outer edge of shield 5 substantially to the center thereof. Thus, slots 38 divide shield 5 into a plurality of segments 36 which are substantially electrically insulated from one another. If necessary for support purposes, adjacent segments of shield 5 may be connected together by coupling members made of electrical insulating material. Slots 38 minimize the appearance of eddy currents in window shield 5, while allowing for efficient coupling of RF energy from the coils to the interior of the processing chamber.

Figure 3:
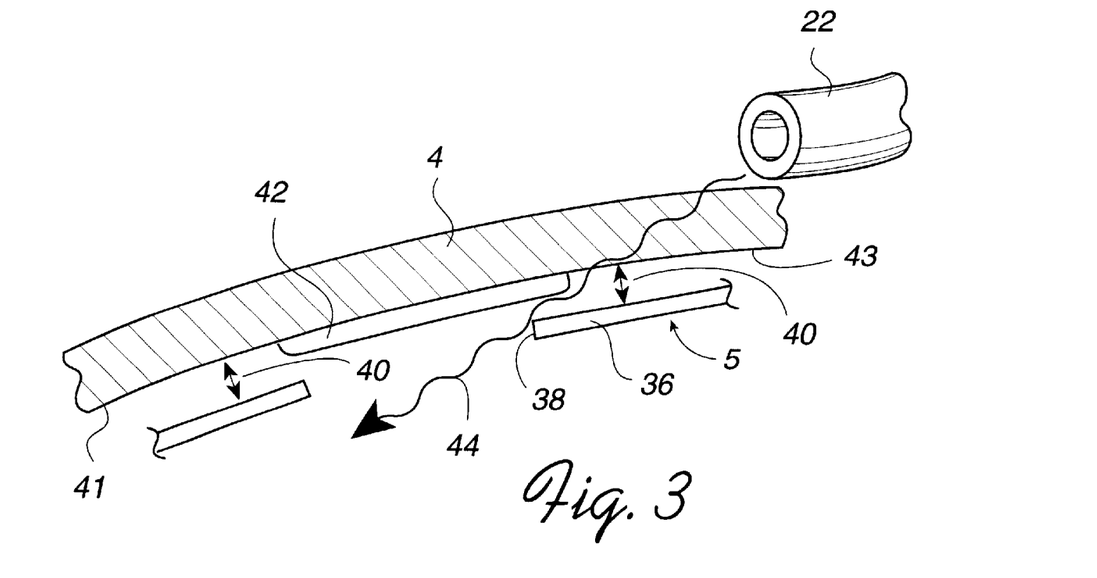
FIG. 3 is a partial cross-sectional view of a portion of the window and window shield of FIG. 1.

As best seen in FIG. 3, window shield 5 is spaced a small distance from window 4 by a gap 40. As a result, even if portions of the inner surface 41 of window 4 which are aligned with slots 38 become coated with conductive deposition material as represented by a coating 42, those portions 43 of window inner surface 41 behind the window shield segments 36 will remain substantially uncoated as shown in FIG. 3. Consequently, paths for flow of magnetic field energy from coils 22, 24 into chamber 2 will exist in gap 40 between window 4 and window shield 36 and in slots 38, as represented by path 44. Although some stray deposition material may deposit on the window inner surface portions 43, it is believed that the deposition will remain sufficiently sparse to permit substantial RF coupling through the window portions 43.

In the illustrated embodiment, the gap 40 between the window 4 and the window shield 5 is approximately 1–2 mm in which the length of the segments 36 have a width which varies from near zero at the center of the window shield 5 to a width of approximately 12 cm (five inches) at the perimeter. The gap 40 is preferably selected to be small enough to minimize the intrusion of deposition material behind the window shield segments 36 and hence minimize the coating of deposition material onto the window inner surface portions 43 behind the segments 36. On the other hand, the gap 40 should be sufficiently large to allow a large number of layers of successive coatings 42 of conductive deposition material to be built up on the window inner surface during successive wafer treatments without the stack of coatings 42 being sufficiently thick to bridge the gap 40 to the window shield 5 and hence block the paths 44 through the gaps 40.

Once the number of coatings has reached a level in which the gaps 40 may begin to close, the window 4 and window shield 5 may be cleaned in situ or alternatively, the window 4 may be replaced with a clean window. In some applications, partial closing of the gaps 40 may be tolerated without adversely affecting the plasma density level and hence the ionization rate of the deposition material.

According to preferred embodiments of the invention, as illustrated in the drawing, coils 22 and 24 are independently powered, coaxially mounted solenoid coils. Outer coil 24 preferably has an outer diameter substantially equal to the diameter of dielectric window 4, while inner coil 22 preferably has an outer diameter in a range of ¼ to ½ of the diameter of dielectric window 4. By adjusting the relation between the power supplied to the two coils, nonuniformities in the plasma created within chamber 2 can be reduced or eliminated. In particular, more homogeneous plasma densities throughout the processing region can be established and maintained.

In further accordance with preferred embodiments of the invention, coils 22 and 24 have a uniform coil pitch, i.e. the spacing between adjacent turns of each coil, and preferably also between the outer turn of coil 22 and the inner turn of coil 24, will be substantially identical. However, the winding pitch can also be made nonuniform in order to improve plasma uniformity in a given installation.

In the disclosed embodiments, coils 22 and 24 may be tubular, ribbon shaped, etc., and may contain a channel for circulation of cooling water. Because the coils 22 and 24 are entirely external to the pressure chamber 2, coupling the coils to suitable RF and coolant sources is readily facilitated because such couplings need not pass through the pressure chamber walls.

In the embodiment shown in FIG. 1, magnet assembly 12 surrounds target 8. The magnetic field produced by magnet assembly 12 serves to enhance ionization within the portion of the plasma field adjacent target 8 and promotes increased deposition rates and uniform target etching according to principles already known in the art.

Figure 4:
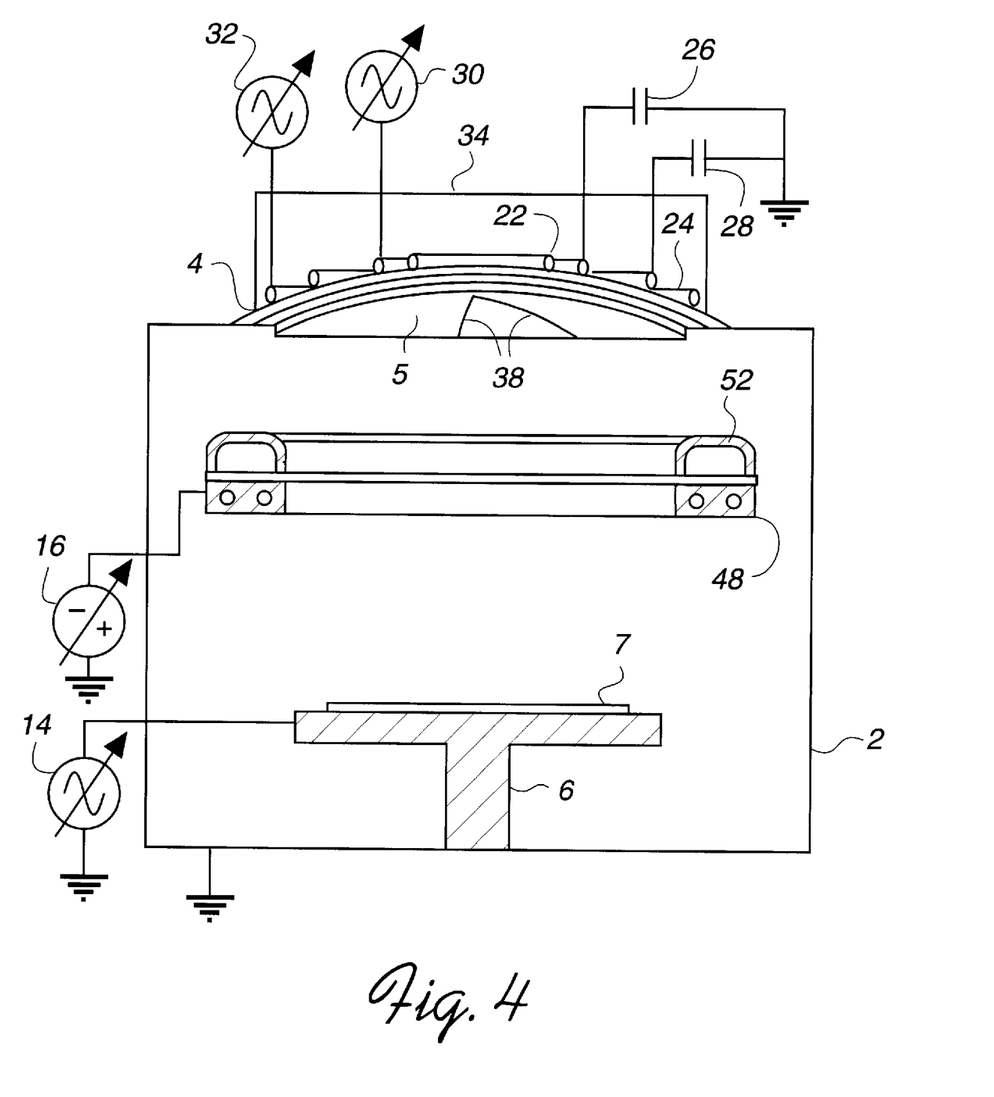
FIGS. 4 and 5 are views similar to those of FIG. 1 showing further embodiments of apparatus according to the invention.

The second embodiment shown in FIG. 4 is identical to the embodiment of FIG. 1 except for the structural arrangement of the target and its associated magnet assembly. Specifically, in the embodiment shown in FIG. 4 magnet assembly 52 is positioned above target 48, i.e. between target 48 and coils 22, 24. Here again, magnet assembly 52 may be either stationary or rotatable about the vertical center axis of chamber 2. In the embodiment of FIG. 4, the magnetic field produced by magnet assembly 52 will be oriented at right angles to the magnetic field produced by magnet assembly 12 of the embodiment shown in FIG. 1.

Target 48 has a ring, or annular, shape, as does target 8 of FIG. 1, and both targets 8 and 48 have an inner diameter which is not smaller than the diameter of the workpiece support surface of support 6. However, target 48 is shaped to be compatible with the orientation of the magnetic field produced by magnet assembly 52.

Figure 5:
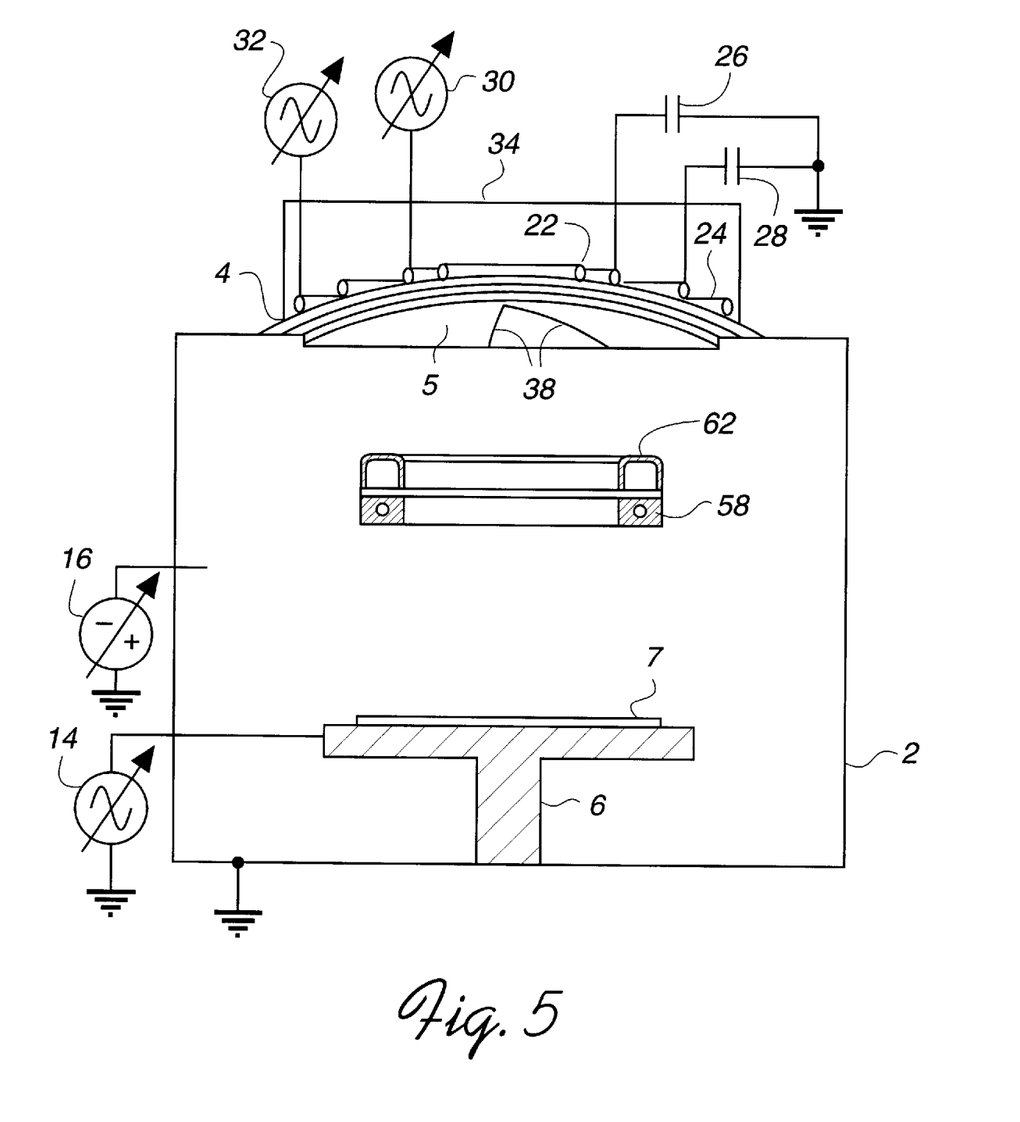

Yet another embodiment shown in FIG. 5 differs from that of FIG. 4 solely with respect to the dimensions of the target and its associated magnet assembly. In the embodiment shown in FIG. 5, target 58 and magnet assembly 62 are dimensioned and positioned to be located in a vertical projection of the space between the outer turn of coil 22 and the inner turn of coil 24. However, there may be some horizontal overlap between the inner and outer diameters of target 58 and magnet assembly 62, on the one hand, and the outer diameter of coil 22 and the inner diameter of coil 24, on the other hand.

According to one feature of the present invention, it is believed that the combination of an annular, or ring-shaped, target as a source of sputtering material and a domed spiral coil for producing an inductively coupled plasma which ionizes metal sputtered from the target, can serve to produce a medium to high density inductively coupled plasma having a more homogeneous plasma density and ionized metal flux than previous ionized sputtering arrangements. In addition, the provision of a slotted metal shield covering the dielectric window can prevent a deposited metal film from covering the entire window while allowing sufficient RF energy to be coupled through the window and shield into the processing region enclosed by chamber 2.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for processing a workpiece, said apparatus comprising:

a processing chamber having a first wall and adapted to contain a plasma about a central axis;

a workpiece support disposed in said processing chamber and having a support surface positioned to support a workpiece centered on said central axis;

a sputtering target disposed in said processing chamber and comprising a conductive material to be sputtered from said target, said target defining an opening facing said workpiece support and positioned around said axis;

a dielectric window forming a part of said first wall of said processing chamber, and facing said target opening so that said axis passes through said window;

at least one coil disposed outside of said processing chamber and adjacent said dielectric window, said coil having at least one turn centered around said axis and being adapted to receive RF energy and generate RF electromagnetic fields positioned to pass through said dielectric window into said chamber to said plasma in said chamber; and a shield disposed within said processing chamber adjacent said dielectric window facing said target opening to prevent deposition of sputtered material onto at least a portion of said dielectric window, the shield being substantially circular and having a plurality of slots extending substantially radially between the edge and the center of the shield providing paths for flow of magnetic energy from said at least one coil into the processing chamber.

2. The apparatus according to claim 1 wherein said at least one coil is a spiral coil carried by said dielectric window outside of said processing chamber.

3. The apparatus according to claim 2 wherein said dielectric window has a dome-shaped surface and said at least one spiral coil is wound to conform to said dome-shaped surface.

4. The apparatus according to claim 3 wherein said shield is composed of a sheet of electrically conductive material.

5. The apparatus according to claim 4 wherein said sheet is provided with a plurality of slots providing paths for flow of magnetic field energy from said at least one coil into said processing chamber.

6. The apparatus according to claim 1 wherein said dielectric window has an inner surface adjacent to but spaced from said shield, and a plurality of slot-shaped coatings of conductive metal deposition material on said inner surface.

7. The apparatus according to claim 6 wherein said shield is spaced from said dielectric window adjacent to each shield slot to create a gap between said shield and said dielectric window coatings adjacent each shield slot.

8. The apparatus according to claim 7 wherein said target comprises a conductive metal material and said dielectric window has an inner surface which includes a first inner surface portion adjacent a shield slot, said first inner surface portion having a coating of conductive target material and wherein said dielectric window inner surface includes a second inner surface portion positioned behind said shield, said second inner surface portion being substantially free of a conductive material coating wherein energy from said coil may be coupled through said dielectric window second inner surface portion and through said gap to said plasma inside said chamber.

9. The apparatus according to claim 7 wherein said dielectric window is a dome-shaped window, said shield is a dome-shaped sheet conforming in shape to said dielectric window and said shield extends across the entirety of said dielectric window.

10. The apparatus according to claim 9 wherein said shield is electrically grounded.

11. The apparatus according to claim 1 wherein said shield is composed of a sheet of electrically conductive material.

12. The apparatus according to claim 11 wherein said shield is spaced from said dielectric window adjacent to each shield slot to create a gap between said shield and said dielectric window adjacent each shield slot.

13. The apparatus according to claim 12 wherein said dielectric window is a dome-shaped window, said shield is a dome-shaped sheet conforming in shape to said dielectric window and said shield extends across the entirety of said dielectric window.

14. The apparatus according to claim 13 wherein said shield is electrically grounded.

15. The apparatus according to claim 1 wherein said at least one coil comprises two spiral coils, and said apparatus further comprises two RF power sources each connected to a respective one of said two spiral coils.

16. The apparatus according to claim 15 wherein each of said RF power sources is adjustable.

17. The apparatus according to claim 15 wherein one of said spiral coils is an inner spiral coil and the other of said spiral coils is an outer spiral coil surrounding said inner spiral coil.

18. The apparatus according to claim 17 wherein said dielectric window is a dome-shaped window having a dome-shaped surface and a diameter, and said two spiral coils are wound to conform to said dome-shaped surface, said outer spiral coil having an outer diameter substantially equal to the diameter of the dome-shaped window and said inner spiral coil having an outer diameter substantially equal to ¼ to ½ of the diameter of the dome-shaped window.

19. The apparatus according to claim 18 wherein said sputtering target is an annular body wherein said target opening is circular.

20. The apparatus according to claim 1 wherein said sputtering target is an annular body wherein said target opening is circular.

21. The apparatus according to claim 20 further comprising a permanent magnet assembly disposed adjacent said annular body.

22. The apparatus according to claim 21 wherein said permanent magnet assembly surrounds said annular body.

23. The apparatus according to claim 21 wherein said permanent magnet assembly is positioned between said annular body and said shield.

24. The apparatus according to claim 23 wherein said at least one coil is a spiral coil having an outer diameter and said annular body has an inner diameter at least as large as the outer diameter of said spiral coil.

25. The apparatus according to claim 24 wherein said at least one spiral coil comprises two spiral coils; said apparatus further comprises two RF power sources each coupled to a respective one of said two spiral coils; one of said spiral coils is an inner spiral coil and the other of said spiral coils is an outer spiral coil surrounding said inner spiral coil; said inner spiral coil has an outer diameter; said outer spiral coil has an inner diameter; and at least a part of said annular body is located between said inner and outer diameters.

26. The apparatus according to claim 25 wherein said annular body is located substantially entirely between said inner and outer diameters.

27. The apparatus according to claim 21 wherein said permanent magnet assembly is stationary.

28. The apparatus according to claim 21 wherein said permanent magnet assembly is rotatable about said annular body.

29. The apparatus of claim 1 wherein the target opening defines an inner diameter and said workpiece support has a workpiece support surface which defines an outer diameter and wherein said target opening inner diameter is greater than said workpiece support surface outer diameter.

30. The apparatus according to claim 1, wherein the slots divide the shield into a plurality of segments which are substantially electrically insulated from one another.

31. The apparatus according to claim 30, wherein adjacent segments of the shield are connected together by coupling members comprising electrically insulating material.

32. A method of processing deposition material, comprising:

sputtering conductive material from a target in a chamber having a central axis, said target defining an opening positioned around said axis and facing a workpiece centered on said axis, said processing chamber having a dielectric window facing said target opening so that said axis passes through said window;

shielding a portion of an inner surface of said dielectric window using a substantially circular shield having a plurality of slot-shaped openings extending substantially radially between the edge and the center of the shield providing paths for flow of RF magnetic field energy from said coil into said processing chamber, the shield facing said target opening to prevent depositing a coating of said conductive material onto said portion; and inductively coupling RF energy through said dielectric window inner surface portion and an opening in said shield to a plasma in the interior of a chamber from an RF coil having at least one turn centered on said axis and positioned outside said chamber to ionize said conductive material for deposition onto said workplace.

33. The method according to claim 32 wherein said coil is a spiral coil carried by said dielectric window outside of said processing chamber.

34. The method according to claim 33 wherein said dielectric window has a dome-shaped outer surface and said spiral coil is wound to conform to said dome-shaped surface.

35. The method according to claim 32 wherein said shield is composed of a sheet of electrically conductive material.

36. The method according to claim 35 wherein said shield is spaced from said dielectric window adjacent to each shield slot-shaped opening to create a gap between said shield and said dielectric window adjacent each shield slot opening.

37. The method according to claim 36 wherein said dielectric window has an inner surface which includes a first inner surface portion adjacent a shield slot-shaped opening, said first inner surface portion having a coating of conductive target material and wherein said dielectric window inner surface includes a second inner surface portion positioned behind said shield, said second inner surface portion being substantially free of a conductive material coating wherein energy from said coil may be coupled through said dielectric window second inner surface portion and through said gap to said plasma inside said chamber.

38. The method according to claim 36 wherein said dielectric window is a dome-shaped window, said shield is a dome-shaped sheet conforming in shape to said dielectric window and said shield extends across the entirety of said dielectric window.

39. The method according to claim 38 wherein said shield is electrically grounded.

40. The method according to claim 32 wherein said coupling further comprises using two spiral coils, and two RF power sources, each coupled to a respective one of said two spiral coils.

41. The method according to claim 40 wherein each of said RF power sources is adjustable.

42. The method according to claim 40 wherein one of said spiral coils is an inner spiral coil and the other of said spiral coils is an outer spiral coil surrounding said inner spiral coil.

43. The method according to claim 42 wherein said dielectric window is a dome-shaped window having a dome-shaped outer surface and said two spiral coils are wound to conform to said dome-shaped surface, said outer spiral coil having an outer diameter substantially equal to the diameter of the dome-shaped window and said inner spiral coil having an outer diameter substantially equal to ¼ to ½ of the diameter of the dome-shaped window.

44. The method according to claim 43 wherein said sputtering includes using a target having an annular body wherein said target opening is circular.

45. The method according to claim 32 wherein said sputtering includes using a target having an annular body wherein said target opening is circular.

46. The method according to claim 45 wherein said sputtering includes using a permanent magnet assembly disposed adjacent said annular body.

47. The method according to claim 46 wherein said permanent magnet assembly surrounds said annular body.

48. The method according to claim 46 wherein said permanent magnet assembly is positioned between said annular body and said shield.

49. The method according to claim 48 wherein said coil is a spiral coil having an outer diameter and said annular body has an inner diameter at least as large as the outer diameter of said spiral coil.

50. The method according to claim 49 wherein said coupling comprises a second spiral coil and two RF power sources each connected to a respective one of said two spiral coils; one of said spiral coils is an inner spiral coil and the other of said spiral coils is an outer spiral coil surrounding said inner spiral coil; said inner spiral coil has an outer diameter; said outer spiral coil has an inner diameter; and at least a part of said annular body is located between said inner and outer diameters.

51. The method according to claim 50 wherein said annular body is located substantially entirely between said inner and outer diameters.

52. The method according to claim 46 wherein said permanent magnet assembly is stationary.

53. The method according to claim 52 wherein said permanent magnet assembly is positioned in the interior of said chamber.

54. The method according to claim 46 wherein said permanent magnet assembly is rotatable about said annular body.

55. The method of claim 32 wherein said target opening defines an inner diameter and said workpiece is supported by a workpiece support surface which defines an outer diameter and wherein said target opening inner diameter is greater than said workpiece support surface outer diameter.

56. The method of claim 32 wherein said shield has a plurality of segments which define a plurality of openings, each segment having a first edge which defines a portion of a first opening and a second edge which defines a portion of a second opening, wherein both said first and second shield segment edges are spaced from said dielectric window to define a gap between each segment edge and said dielectric window to provide a path for flow of RF electromagnetic energy from said coil, through said gap and into said processing chamber and wherein said gap is approximately 1–2 mm.

57. The method of claim 56 wherein said gap is 1 to 2 mm.

58. A method of processing deposition material, comprising:

sputtering conductive material from a sputtering target defining an opening positioned around a central axis and facing a workpiece centered on said axis in a chamber onto said workpiece, onto a dielectric window facing said target opening and onto a substantially circular shield having a plurality of slot-shaped openings extending substantially radially between the edge and the center of the shield, the shield positioned facing said target opening and adjacent said dielectric window, said sputtering including depositing conductive material through a plurality of openings defined by a plurality of segments of said shield onto a first portion of an inner surface of said dielectric window to form a first coating of said conductive material, and blocking deposition of said conductive material onto a second portion of said inner surface of said dielectric window using said shield segments to prevent depositing a coating of said conductive material onto said second portion wherein each segment has a first edge which defines a portion of a first opening and a second edge which defines a portion of a second opening, wherein both said first and second shield segment edges are spaced from said dielectric window to define a plurality of gaps, each gap between each segment edge and said dielectric window to provide a path for flow of RF electromagnetic energy from said coil, through said gap and into said processing chamber and wherein each gap is approximately 1–2 mm; and inductivity coupling RF energy through said dielectric window inner surface second portion, through said gaps and through said shield openings to a plasma in the interior of a chamber from an RF coil positioned outside said chamber, to ionize said material wherein said axis passes through said window and said RF coil has at least one turn centered on said axis.

59. An apparatus for processing a workpiece, said apparatus comprising:

a processing chamber having a first wall and adapted to contain a plasma about a central axis;

a workpiece support surface disposed in said processing chamber and adapted to support a workpiece centered on said axis;

ring-shaped sputtering means disposed in said processing chamber for sputtering conductive material onto a workpiece support by said support, said target means having an annular-shaped sputtering surface which defines an opening facing said workpiece support and positioned around said axis;

a dielectric window forming a part of said first wall of said processing chamber, and facing said target opening so that said axis passes through said window;

coil means having at least one turn centered on said axis and disposed outside of said processing chamber and adjacent said dielectric window, for receiving RF energy and generating RF energy positioned to pass through said dielectric window into said chamber to energize said plasma in said chamber to ionize said sputtered material for deposition on said workpiece; and shield means disposed within said processing chamber adjacent said dielectric window and facing said target opening, for preventing deposition of sputtered material onto at least a portion of said dielectric window wherein said shield means has a plurality of segments which define a plurality of openings, each segment having a first edge which defines a portion of a first opening and a second edge which defines a portion of a second opening, wherein both said first and second shield segment edges are spaced from said dielectric window to define a gap between each segment edge and said dielectric window to provide a path for flow of RF energy from said coil means, through said gap and into said processing chamber and wherein said gap is approximately 1–2 mm, the shield means being substantially circular and having a plurality of slots extending substantially radially between the edge and the center of the shield means.

60. The apparatus of claim 1 wherein said shield has a plurality of segments which define a plurality of openings, each segment having a first edge which defines a portion of a first opening and a second edge which defines a portion of a second opening, wherein both said first and second shield segment edges are spaced from said dielectric window to define a gap between each segment edge and said dielectric window to provide a path for flow of RF electromagnetic energy from said coil, through said gap and into said processing chamber and wherein said gap is approximately 1–2 mm.

61. The apparatus of claim 60 wherein said gap is 1 to 2 mm.

62. An apparatus for processing a workpiece, said apparatus comprising:

a processing chamber having a first wall and adapted to contain a plasma about a central axis;

a workpiece support disposed in said processing chamber and having a support surface positioned to support a workpiece centered on said central axis;

a sputtering target disposed in said processing chamber and comprising a conductive material to be sputtered from said target, said target defining an opening facing said workpiece support and positioned around said axis;

a dielectric window forming a part of said first wall of said processing chamber, and facing said target opening so that said axis passes through said window;

at least one coil disposed outside of said processing chamber and adjacent said dielectric window, said coil having at least one turn centered around said axis and being adapted to receive RF energy and generate RF electromagnetic fields positioned to pass through said dielectric window into said chamber to said plasma in said chamber; and a substantially circular shield disposed within said processing chamber adjacent said dielectric window facing said target opening to prevent deposition of sputtered material onto at least a portion of said dielectric window, the shield having a plurality of slots providing paths for flow of magnetic energy from said at least one coil into the processing chamber, the slots dividing the shield into a plurality of segments that are substantially electrically insulated from one another.

63. The apparatus of claim 62, wherein the slots of the shield extend substantially radially between the edge and the center of the shield.

64. The apparatus of claim 63, wherein adjacent segments of the shield are connected together by coupling members comprising electrically insulating material.

* * * * *

UNITED STATES PATENT AND TRADEMARK OFFICE
CERTIFICATE OF CORRECTION

PATENT NO. : 6,535,717 B1
DATED : March 18, 2003
INVENTOR(S) : K Matsuhima et al.

It is certified that error appears in the above-identified patent and that said Letters Patent is hereby corrected as shown below:

<u>Title page,</u>
Item [73], second assignee, please add
-- FFC LIMITED
1, Fujimachi, Hino-Shii --

Signed and Sealed this

Fourth Day of May, 2004

JON W. DUDAS
*Acting Director of the United States Patent and Trademark Office*